(12) United States Patent
Yeh

(10) Patent No.: US 6,794,910 B2
(45) Date of Patent: Sep. 21, 2004

(54) METHOD AND CIRCUIT FOR SYNCHRONIZING SIGNALS

(75) Inventor: Chia-yow Yeh, Changhua (TW)

(73) Assignee: Cheerteck, Inc. (TW)

(*) Notice: Subject to any disclaimer, the term of this patent is extended or adjusted under 35 U.S.C. 154(b) by 0 days.

(21) Appl. No.: 10/617,481

(22) Filed: Jul. 10, 2003

(65) Prior Publication Data

US 2004/0104749 A1 Jun. 3, 2004

(30) Foreign Application Priority Data

Nov. 28, 2002 (TW) .................................... 91134761 A

(51) Int. Cl.[7] .............................................. H03L 7/00
(52) U.S. Cl. .................................... 327/145; 327/298
(58) Field of Search .............................. 327/141, 144, 327/145, 291, 294, 298, 355, 407

(56) References Cited

U.S. PATENT DOCUMENTS 4,682,250 A * 7/1987 Hirota ........................ 386/46
6,295,614 B1 * 9/2001 Peters et al. ................ 714/704
6,480,049 B2 * 11/2002 Boerstler et al. ........... 327/299
6,496,548 B1 * 12/2002 Schneider et al. .......... 375/317
6,525,520 B2 * 2/2003 Davidsson et al. ....... 324/76.54

* cited by examiner

Primary Examiner—Timothy P. Callahan
Assistant Examiner—Cassandra Cox
(74) Attorney, Agent, or Firm—Martine & Penilla, LLP

(57) ABSTRACT

The invention relates to a method and circuit for synchronizing two signals triggered by clocks of different frequencies, which samples the lower frequency write-enable signal at both positive and negative edges of the higher frequency clock. If the sampling result at the positive or negative edge of the higher frequency clock is "1", the state is recorded to be a "lock state" and no sampling is taken from the next opposite edge. If the sampling result at the positive or negative edge is "0", the state is recorded to be a "sampling state" and the next opposite edge will be sampled. Finally, the sampling results taken at the positive and negative edges are joined to output a synchronized write-enable signal.

9 Claims, 4 Drawing Sheets

METHOD AND CIRCUIT FOR SYNCHRONIZING SIGNALS

1. FIELD OF INVENTION

The invention relates to a method and circuit for synchronizing signals and, more particularly, to a method and circuit that synchronizes two signals triggered by clocks of different frequencies.

2. RELATED ART

As the design for integrated circuit (IC) is becoming more and more complicated, more and more designers are using electronic design automation (EDA) aiding tools in the designing process, to help finding any faults in advance and analyzing and optimizing the completeness of the testing samples, so as to reduce the waste of any redundant or unnecessary testing time, and to reduce the time required for development. Using this kind of aiding tools can help to design a circuit in which signals are triggered by clocks of the same frequency, to easily simulate and analyze the circuit to get a reliable result.

However, the designers still have to face the timing problems caused by signals triggered by clocks of different frequencies. For instance, in a camera using a 48 MHz advanced RISC machine (ARM), in order to achieve certain functionality, the circuit uses clocks of a higher frequency, such as 100 MHz. However, signals input to its sensor are synchronized with 13.5 or 27 MHz, but the corresponding circuit uses clocks of 27 MHz. Accordingly, this kind of timing problem cannot be simulated or analyzed by the EDA aiding tools to get a reliable result.

As shown in FIG. 1a, a first module 11 operates at a lower frequency, uses a lower frequency clock LCK to process a write-enable signal WE, and transmits data in a first register 111 to a second module 12. The second module 12 uses clocks of the higher frequency clock HCK to sample from the write-enable signal WE, in order to receive data transmitted from the first module 11 and store the data in a second register 121 of the second module 12. When the write-enable signal WE has a high potential, that is, at the state of 1, the second module 12 can receive the data transmitted from the first module 11 and store the data into the second register 121.

FIG. 1b shows a timing diagram of the write-enable signal WE and the higher frequency clock HCK in FIG. 1a. The second module 12 samples the asynchronous write-enable signal WE when the clock is at state 1. Referring to FIG. 1b, the second module 12 may miss the sampling result of the write-enable signal WE at the position due to an in sufficient set up time for the second module 12 to confirm the sampled write-enable signal WE. After a sufficient amount of time, at position b, the second module 12 can then successfully read the write-enable signal WE and thus enable the data write-in. When facing this kind of timing problems of clocks with different frequencies, the designers have to spend enormous amount of time to check each output result and to carry out fine tuning for the circuit, in order to meet the expected result. In addition, when facing the circuit design modification or procedure alteration, the designers must re-check and fine-tune the circuit design, which prolongs the time for development and design.

Therefore, it is an important subject of the invention to solve the above-mentioned timing problems when synchronizing two circuit modules triggered by clocks of different frequencies, so that analytical results of the EDA aiding tool are reliable, and the development time is reduced.

3. SUMMARY OF THE INVENTION

In view of the aforementioned problems, the object of the invention is to provide a method and circuit for synchronizing two signals triggered by clocks of different frequencies. This can resolve the timing problems caused by two signals triggered by clocks of different frequencies, so that circuit designer need not to spend too much time on solving timing problems, which reduces development time for circuit design.

Another object of the invention is to provide a method and circuit for synchronizing two signals triggered by clocks of different frequencies, which can make the simulation analysis result of electronic design automation (EDA) aiding tool reliable.

In order to achieve the aforementioned objects of the invention, the method for synchronizing two signals triggered by clocks of different frequencies in accordance with the invention is to sample from a lower frequency write-enable signal at both positive and negative edges of a higher frequency clock. If the sampling result shows that the positive edge is at a low potential, which is at state 0, another sampling will be taken at the next negative edge. If the sampling result shows that the negative edge is at a high potential, which is at state 1, no sampling will be taken at the next positive edge. That is, if the sampling result is 1 for the positive or negative edge of the higher frequency clock, no sampling will be taken at the next opposite edge. If the sampling result is 0 for the positive or negative edge of the higher frequency clock, a sampling will be taken at the next opposite edge. Finally, the sampling results taken at the positive and negative edges are joined to output a synchronized write-enable signal.

Furthermore, the circuit for implementing the aforementioned method for synchronizing two signals triggered by clocks of different frequencies includes a recording circuit and a sampling circuit. The recording circuit records states required for the positive and negative edges of the higher frequency clock. The sampling circuit samples at the opposite edges based on the states recorded in the recording circuit. It also joins the sampling results taken at the positive and negative edges to output a synchronized write-enable signal.

The recording circuit includes a first D-type flip-flop and a second D-type flip-flop, both are positive-edge triggered. The first D-type flip-flop records the states after sampling at the positive edge. The second D-type flip-flop records the states after sampling at the negative edge. The sampling circuit includes a first AND-gate, a third D-type flip-flop, a second AND-gate, a fourth D-type flip-flop, an OR-gate, and a fifth D-type flip-flop. The third D-type flip-flop, fourth D-type flip-flop and the fifth D-type flip-flop are all positive-edge triggered. The first AND-gate and the second AND-gate are used for controlling the lower frequency write-enable signal to be input to the third D-type flip-flop and the fourth D-type flip-flop. The third D-type flip-flop and the fourth D-type flip-flop are used for sampling from the lower frequency write-enable signal at the negative and positive edges. When the states of the first D-type flip-flop and the second D-type flip-flop are recorded as "lock states", the output of the first AND-gate and the second AND-gate are also "0". This means that the third D-type flip-flop and the fourth D-type flip-flop take no sampling operation, and the output result is also "0". When the states of the first D-type flip-flop and the second D-type flip-flop are recorded as "sampling states", the first AND-gate and the second AND-gate change their outputs in compliance with the lower frequency write-enable signal, and sample and output results through the third D-type flip-flop and the fourth D-type flip-flop. After that, the OR-gate joins and the sampling results taken at the positive and negative edges to output a synchronized write-enable signal. The fifth D-type flip-flop controls the conversion of the synchronized write-enable signal at the positive edge of the higher frequency clock. The higher frequency module can then sample the synchronized write-enable signal at the positive edge of the higher frequency clock to receive data transmitted from the lower frequency module.

According to the method and the circuit for synchronizing two signals triggered by clocks of different frequencies, the lower frequency write-enable signal generated by the first module and the higher frequency clock of the second module can be synchronized to generate a synchronized write-enable signal. After that, the second module uses the synchronized write-enable signal to trigger and receive data transmitted from the first module. Thus, the two modules can be taken as synchronizing modules, which can use EDA aiding tools to help designers to simulate and analyze to obtain a reliable result, in order to reduce time required for development and design.

4. BRIEF DESCRIPTION OF THE DRAWINGS

FIG. 1b is a timing diagram showing the lower frequency write-enable signal and the higher frequency clock of FIG. 1a.

FIG. 4b is a timing diagram showing a corresponding circuit as shown in FIG. 4a.

5. DESCRIPTION OF THE PREFERRED EMBODIMENT

Figure 1A:
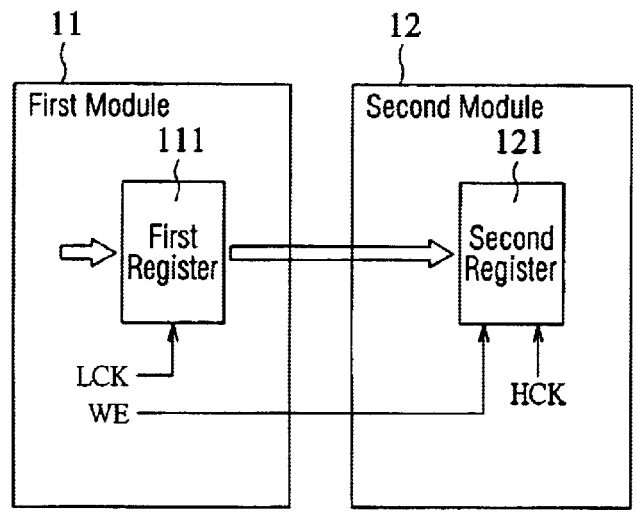
FIG. 1a is a schematic diagram showing conventional data transmission between modules triggered by clocks of different frequencies.
Figure 1B:
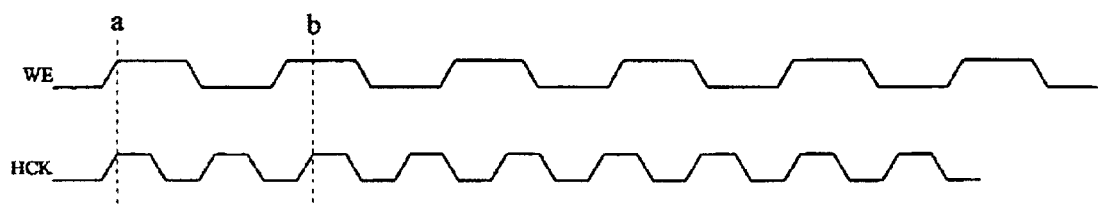

A method and circuit for synchronizing two signals triggered by clocks of different frequencies in accordance with the preferred embodiment of the invention will be described with reference to the accompanying drawings, in which like reference numerals denote like components.

Figure 2:
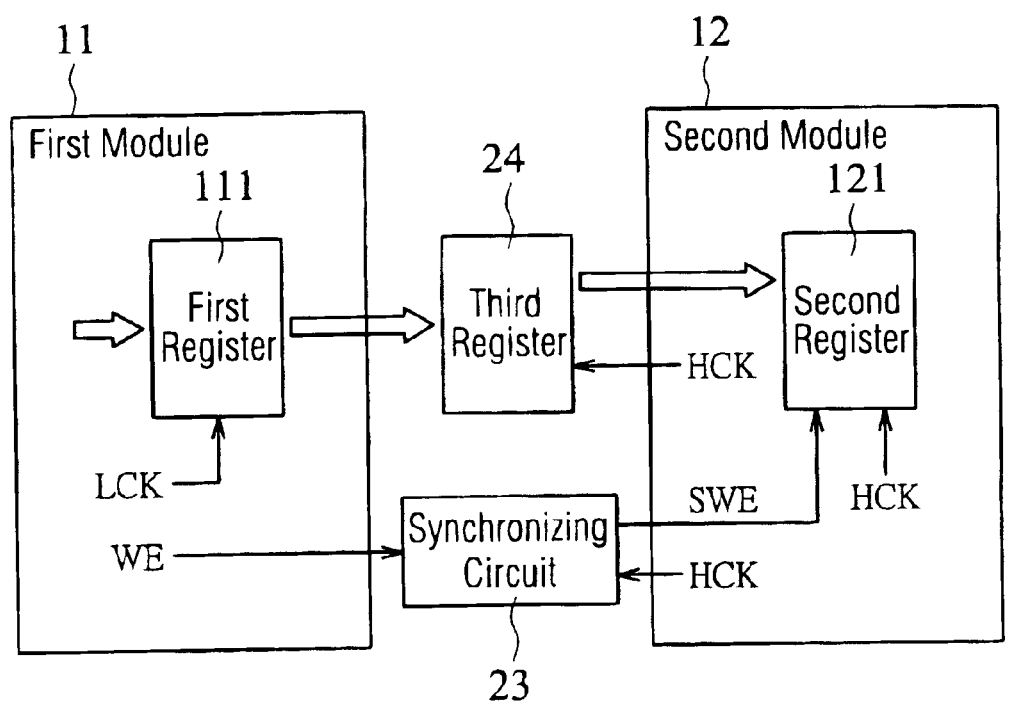
FIG. 2 is a schematic diagram showing the method and circuit for synchronizing two signals triggered by clocks of different frequencies in accordance with one embodiment of the invention, to transmit data between modules which are triggered by clocks of different frequencies.

Referring to FIG. 2, a synchronizing circuit 23 is provided between a first module 11 and a second module 12. After the synchronizing circuit 23 has synchronized a write-enable signal WE output from the first module 11 with a higher frequency clock HCK, the synchronizing circuit 23 outputs a synchronized write-enable signal SWE. The second module 12 then uses the higher frequency clock HCK to sample the synchronized write-enable signal SWE in order to receive data transmitted from the first module 11 and store the data temporarily in a second register 121. In this way, the aforementioned problems in conventional techniques can be solved. The method for synchronizing two signals triggered by clocks of different frequencies will be described in detail as follows.

Figure 3:
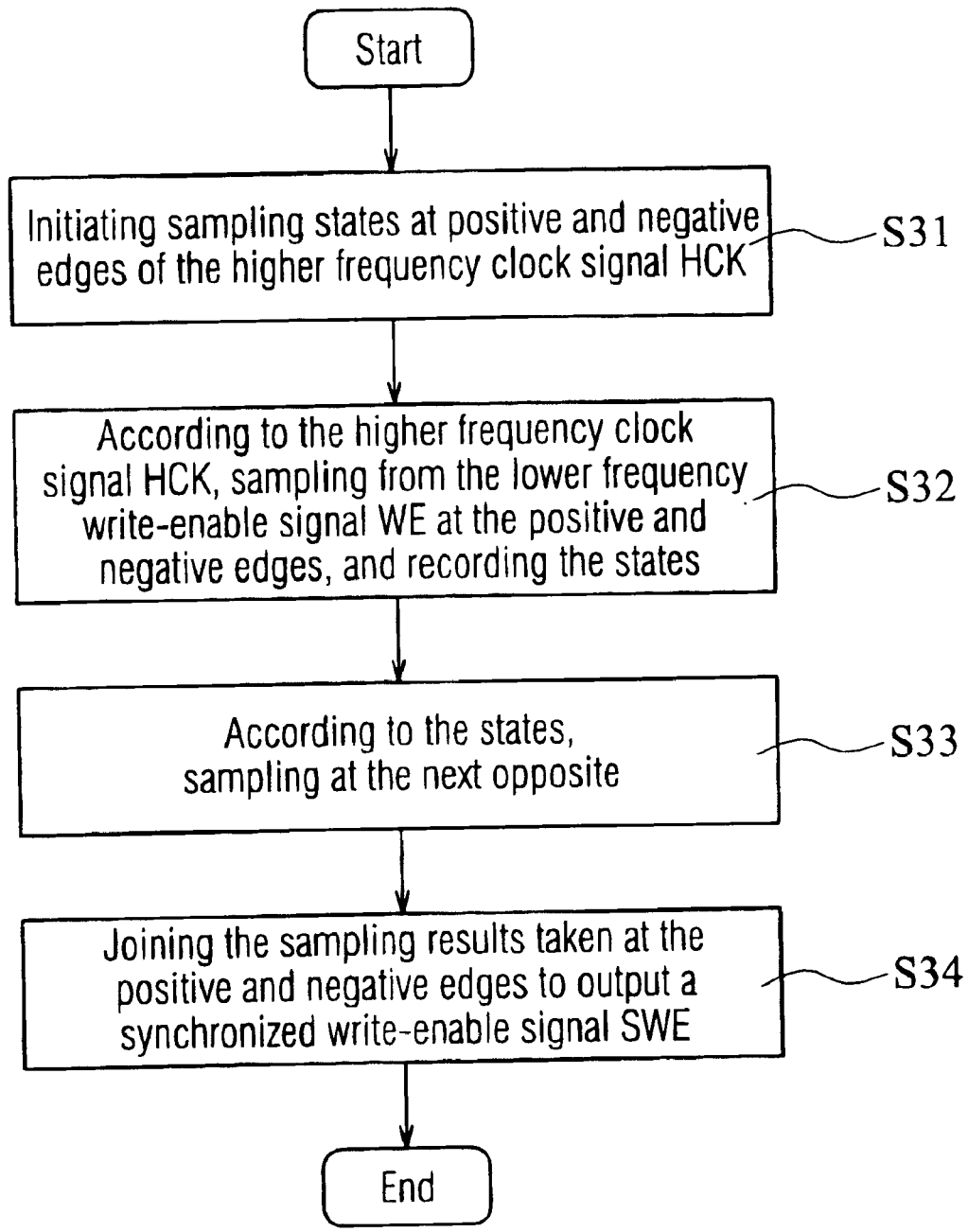
FIG. 3 is a flow chart showing the steps for implementing the method for synchronizing two signals triggered by clocks of different frequencies in accordance with one embodiment of the invention.

The key point of the method in accordance the invention is to sample from the lower frequency write-enable signal WE at both positive edge and negative edge of the higher frequency clock HCK. The implementation steps will be described with reference to FIG. 3. As shown in FIG. 3, the sampling from the lower frequency write-enable signal WE at the positive and negative edges of the higher frequency clock HCK can be separated into two situations. One is a "sampling state" where the lower frequency write-enable signal is sampled, and the other is a "lock state" where no sampling takes place. Firstly, the states at the positive and negative edges of the higher frequency clock HCK are initiated to be a "sampling state" (S31). That is, during the initiating stage, the lower frequency write-enable signal WE is sampled at both positive and negative edges of the higher frequency clock HCK. Then, as the higher frequency clock HCK switching between positive and negative edges, the lower frequency write-enable signal WE is sampled at the positive and negative edges respectively, and the results are recorded as states of the positive and negative edges of the higher frequency clock HCK (S32). After that, according to the recorded states of the positive and negative edges, a corresponding operation is performed at the next opposite edge (S33). The states are changed according to the rules as follows. If the sampling result shows that the lower frequency write-enable signal WE is at high potential (i.e., the state 1) at the positive edge of the higher frequency clock HCK, the state at the positive edge will be changed to a "lock state". If the sampling result taken at the positive edge of the next clock cycle is at a low potential (i.e., the state 0), the state at the positive edge will be changed to a "sampling state". Similarly, if the sampling result of the lower frequency write-enable signal WE is 1 at the negative edge of the higher frequency clock HCK, the state of the negative edge will be changed to a "lock state". If the sampling result of the negative edge of the next clock cycle is 0, the state of the negative edge will be changed to a "sampling state".

If at the positive edge of the higher frequency clock HCK, the state of the preceding negative edge is in a sampling state, this means that the sampling result of the lower frequency write-enable signal is 0 at the preceding negative edge, and thus a sampling must be taken at the current positive edge. If the state of the preceding negative edge is in a lock state, this means that the sampling result of the lower frequency write-enable signal WE is 1, and thus it is not necessary to sample at the current positive edge. In the same way, whether to sample at the current negative edge is determined by the sampling result at the preceding positive edge, which will not be elaborated here.

Finally, the sampling results of the lower frequency write-enable signal taken respectively at the positive edge and the negative edge of the higher frequency clock HCK are joined to output a synchronized write-enable signal SWE (S34). That is, at the positive or negative edge of the higher frequency clock HCK the sampling result of the lower frequency write-enable signal WE is 1, the output signal is also 1.

Figure 4A:
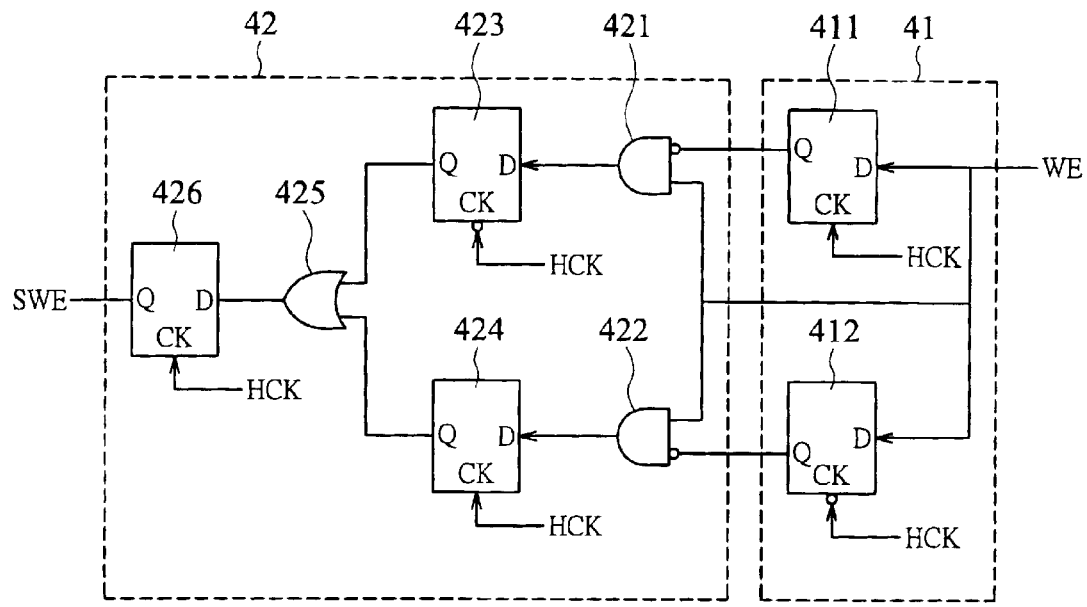
FIG. 4a shows the circuit for synchronizing two signals triggered by clocks of different frequencies in accordance with one embodiment of the invention.

Referring to FIG. 4a, a circuit for synchronizing two signals triggered by clocks of different frequencies in accordance with an embodiment of the invention includes a recording circuit 41 and a sampling circuit 42. The recording circuit 41 records states of a higher frequency clock HCK at positive and negative edges. The recording circuit 41 includes a first D-type flip-flop 411 and a second D-type flip-flop 412, both are positive-edge triggered. The first D-type flip-flop 411 has a D terminal for receiving the lower frequency write-enable signal WE, a CK terminal for receiving the higher frequency clock HCK, and a Q terminal connected externally and with an initial state 0 representing a sampling state. Since the first D-type flip-flop 411 is triggered at the positive edge of the higher frequency clock HCK, if the input lower frequency write-enable signal WE is 1, the output of the Q terminal will be 1, which represents a lock state. If the input lower frequency write-enable signal WE is 0, the output of the Q terminal will be 0, which represents a sampling state. From the aforementioned description, the first D-type flip-flop 411 is to record the state at the positive edge of the higher frequency clock HCK.

The second D-type flip-flop 412 has a D terminal for receiving the lower frequency write-enable signal WE, a CK terminal for receiving an opposite state of the higher frequency clock HCK, a Q terminal connected externally and with an initial state 0 representing a sampling state. Since the second D-type flip-flop 412 is positive-edge triggered, when at the negative edge of the higher frequency clock HCK, after inverting the state, the second D-type flip-flop 412 is triggered. If the input lower frequency write-enable signal WE is 1, the output of the Q terminal is 1, representing a lock state. If the input lower frequency write-enable signal WE is 0, the output of Q terminal is 0, representing a sampling state. Therefore, the second D-type flip-flop 412 is used to record the state at the negative edge of the higher frequency clock HCK.

The sampling circuit 42 samples from a lower frequency write-enable signal WE according to the states recorded in the recording circuit 41 at the positive and negative edges of the higher frequency clock HCK. Then, the sampling results obtained respectively at the positive and negative edges are joined to output a synchronized output signal SWE. The sampling circuit 42 includes a first AND-gate 421, a third D-type flip-flop 423, a second AND-gate 422, a fourth D-type flip-flop 424, an OR-gate 425 and a fifth D-type flip-flop 426. The third D-type flip-flop 423, the fourth D-type flip-flop 424 and the fifth D-type flip-flop 426 are all positive-edge triggered.

The first AND-gate 421 has an input terminal for receiving the lower frequency write-enable signal WE, another input terminal for receiving the inverse state of the Q terminal output from the first D-type flip-flop 411 of the recording circuit 41, and an output terminal externally connected to the D terminal of the third D-type flip-flop 423. The third D-type flip-flop 423 has a CK terminal for receiving the inverse state of the higher frequency clock HCK, and a Q terminal externally connected to an input terminal of the OR-gate 425 and with an initial state 0. The second AND-gate 422 has an input terminal for receiving the lower frequency write-enable signal WE, another input terminal for receiving the inverse state of the Q terminal output from the second D-type flip-flop 412 of the recording circuit 41, and an output terminal externally connected to the D terminal of the fourth D-type flip-flop 424. The CK terminal of the fourth D-type flip-flop 424 receives the higher frequency clock HCK, and the Q terminal of the fourth D-type flip-flop 424 is externally connected to another input terminal of the OR-gate 425 and with an initial state 0.

The operation of the above-mentioned circuit will be described as follows. Since the third D-type flip-flop 423 is positive-edge triggered, at the negative edge of the higher frequency clock HCK, therefore, after inverting the state, the third D-type flip-flop 423 is triggered to sample from the lower frequency write-enable signal WE. The input of the D terminal is the intersected result from the lower frequency write-enable signal WE and the inverted output of the first D-type flip-flop 411. If lower frequency write-enable signal WE is 0, the output of the first AND-gate 421 must be 0, the sampling result of the lower frequency write-enable signal WE taken by the third D-type flip-flop 423 is also 0, which is output to the OR-gate 425. If the first D-type flip-flop 411 is in a lock state and outputs 1, after being inverted the state and input to the first AND-gate 421, the output of the first AND-gate 421 will also be 0, the sampling result of the third D-type flip-flop 423 is also 0. This means that the sampling result obtained from the lower frequency write-enable signal WE at the preceding positive edge of the current negative edge of the higher frequency clock HCK is 1, and through the first D-type flip-flop 411 to record the state as a lock state. Therefore, at this negative edge, no sampling is taken from the lower frequency write-enable signal WE, and third D-type flip-flop 423 outputs 0. On the other hand, when the sampling result of the preceding positive edge is 0, the first D-type flip-flop 411 records the state as a sampling state, outputs 0, and samples at the negative edge. If the sampling result of the lower frequency write-enable signal WE is 0, the third D-type flip-flop 423 outputs 0, if the result is 1, then the third D-type flip-flop 423 outputs 1.

In the same way, the sampling of the fourth D-type flip-flop 424 is triggered at the positive edge of the higher frequency clock HCK. The sampling result is influenced by the lower frequency write-enable signal WE and the state of the preceding negative edge recorded in the second D-type flip-flop 412. That is, if the sampling result at the preceding negative edge is 1, the second D-type flip-flop 412 records the state as a lock state, and the fourth D-type flip-flop 424 outputs 0. When the second D-type flip-flop 412 records the state as a sampling state, and the lower frequency write-enable signal WE is 1, then the sampling result of the fourth D-type flip-flop 424 is 1 and it outputs 1. Finally, the OR-gate 425 joins the sampling results of the lower frequency write-enable signal WE taken at the positive and negative edges of the higher frequency clock HCK and outputs a synchronized write-enable signal SWE.

In addition, the output of the OR-gate 425 can be connected to the D terminal of the fifth D-type flip-flop 426. The fifth D-type flip-flop 426 has a CK terminal of for receiving the higher frequency clock HCK, a Q terminal connected externally for outputting the synchronized write-enable signal SWE and with an initial state 0. Thus, the synchronized write-enable signal SWE only changes at the positive edges of the higher frequency clock HCK. When the synchronized write-enable signal SWE is transmitted to the second module 12, the synchronized write-enable signal SWE is sampled at the positive edge of the higher frequency clock HCK and, according to the sampling result, data transmitted from the first module 11 is accepted.

Figure 4B:
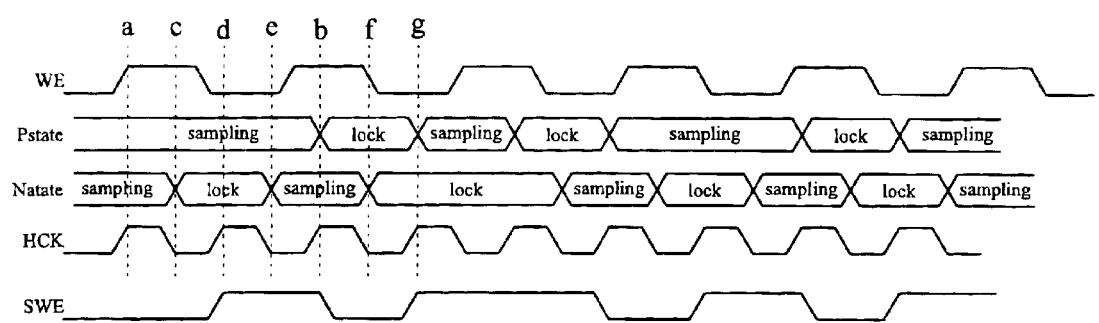

FIG. 4b shows a timing diagram of the above-mentioned embodiment. At position a, the higher frequency clock HCK is at a positive edge, and the lower frequency write-enable signal WE is sampled. Since it requires a sufficient setup time to confirm the result obtained from the write-enable signal WE, this write-enable signal WE is therefore missed, the state at the positive edge is kept as a sampling state. At position c, the higher frequency clock HCK is at the negative edge and a sampling is performed. Since the sampling result is 1, the state at the negative edge is changed to a lock state. The sampling results taken at the positive and negative edges are joined to output 1. However, the fifth D-type flip-flop 426 can only be triggered at the positive edge, thus the joining result is delayed until position d to output the waveform of the synchronized write-enable signal SWE. In the meantime, the positive edge sampling result at position d is still 0, hence it still maintains at the sampling state. Until 1 is sampled at position b that the state is changed to a lock state, and when 0 is sampled at position g the state is changed back to a sampling state. For the same reason, at position e, the sampling result at the negative edge is 0, the original lock state is changed to a sampling state. At position f, the sampling result is 1, then the state is changed to a lock state.

From the timing diagram in FIG. 4b, the waveform change of the synchronized write-enable signal SWE is delayed by one clock cycle comparing to the lower frequency write-enable signal WE. Therefore, a third register 24 can be provided between the first module 11 and second module 12 (as shown in FIG. 2). The data transmitted from the first module 11 to the second module 12 are stored temporarily in the third register 24. The data are transmitted to the second module 12 later, the third register 24 is triggered by the positive edge of the higher frequency clock HCK.

According to one embodiment of the invention, the lower frequency write-enable signal WE has been synchronized with the higher frequency clock HCK to output a synchronized write-enable signal SWE. Therefore, the second module 12 working on a higher frequency can directly sample the synchronized write-enable signal SWE. Therefore, it can be considered as synchronizing with the first module 11 working on a lower frequency, and thus the conventional timing problem between the two modules no longer exist. Accordingly, the two modules working on different frequencies are regarded as being synchronized. Thus, the analytical result of the EDA aiding tool simulation is as reliable as the result obtained from analyzing a synchronizing circuit. For this reason, the designer does not have to spent too much time on dealing with the timing problems caused by different clocks, and can directly rely on the analytical result from the EDA aiding tools, to effectively reduce the time required for development.

While the invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the invention.

What is claimed is:

1. A circuit for synchronizing two signals triggered by clocks of different frequencies, comprising:
    a recording circuit for recording sampling states of a higher frequency clock at a positive edge and a negative edge; and
    a sampling circuit for sampling a lower frequency write-enable signal at opposite edges of the positive edge and the negative edge according to the states, and joining sampling results respectively sampled from the positive edge and the negative edge to output a synchronized output signal.

2. The circuit of claim 1, wherein the recording circuit comprises:
    a first D-type flip-flop, which is positive-edge triggered, for recording the state at the positive edge of the higher frequency clock, wherein the first D-type flip-flop has a D terminal for receiving the lower frequency write-enable signal, a CK terminal for receiving the higher frequency clock, and a Q terminal connected externally and with an initial state 0; and
    a second D-type flip-flop, which is positive-edge triggered, for recording the state at the negative edge of the higher frequency clock, wherein the second D-type flip-flop has a D terminal for receiving the lower frequency write-enable signal, a CK terminal for receiving an inverse state of the higher frequency clock, and a Q terminal connected externally and with an initial state 0.

3. The circuit of claim 2, wherein the Q terminal of the first D-type flip-flop has an output 0 means that a state at the positive edge of the higher frequency clock is a sampling state, whereas an output is 1 means that the state is a lock state.

4. The circuit of claim 2, wherein an output of the Q terminal of the second D-type flip-flop is 0 means that a state at the negative edge of the higher frequency clock is a sampling state, whereas an output is 1 means that the state is a lock state.

5. The circuit of claim 1, wherein the sampling circuit comprises:
    a first AND-gate having an input terminal for receiving the lower frequency write-enable signal, another input terminal for receiving an inverse state output by the Q terminal of the first D-type flip-flop, and an output terminal connected externally;
    a third D-type flip-flop, which is positive-edge triggered, for sampling from the lower frequency write-enable signal at the negative edge of the higher frequency clock, wherein the third D-type flip-flop has a D terminal for receiving signals output from the first AND-gate, a CK terminal for receiving an inverse state of the higher frequency clock, a Q terminal connected externally and with an initial state 0;
    a second AND-gate having an input terminal for receiving the lower frequency write-enable signal, another input terminal for receiving an inverse state output by the Q terminal of the second D-type flip-flop, and an output terminal connected externally;
    a fourth D-type flip-flop, which is positive-edge triggered, for sampling from the lower frequency write-enable signal at the positive edge of the higher frequency clock, wherein the fourth D-type flip-flop has a D terminal for receiving signals output by the second AND-gate, a CK terminal for receiving the higher frequency clock, and a Q terminal connected externally and with an initial state 0; and
    an OR-gate having an input terminal for receiving an output of the Q terminal of the third D-type flip-flop, another input terminal for receiving an output of the Q terminal of the fourth D-type flip-flop, and an output terminal connected externally.

6. The circuit of claim 5, wherein the sampling circuit further comprises a fifth D-type flip-flop, which is positive-edge triggered, and has a D terminal for receiving signals output by the OR-gate, a CK terminal for receiving the higher frequency clock, and a Q terminal connected externally and with an initial state 0.

7. A method for synchronizing two signals triggered by clocks of different frequencies, comprising the steps of:
    (a) initializing states at a positive edge and a negative edge of a higher frequency clock to be sampling states;
    (b) sampling from a lower frequency write-enable signal at the positive edge and the negative edge of the higher frequency clock, respectively, and recording states at the positive edge and the negative edge of the higher frequency clock;
    (c) sampling at a next opposite edge according to each state at the positive edge and the negative edge of the higher frequency clock,; and (d) joining sampling results of the lower frequency write-enable signal obtained respectively at the positive edge and the negative edge of the higher frequency clock, and outputting a synchronized write-enable signal.

8. The method of claim 7, wherein the states in the step (b) is changed according to that:

if the sampling result from the lower frequency write-enable signal at the positive edge or the negative edge of the higher frequency clock is 1, the state at the positive edge or the negative edge is changed to be a lock state, or if the sampling result is 0, the state at the positive edge or the negative edge is changed to be a sampling state.

9. The method of claim 8, wherein the sampling in the step (c) is performed according to that:

if a preceding positive edge of a current negative edge of the higher frequency clock is in a sampling state, the sampling result of the negative edge is valid, if the sampling result is 0, the output is 0, if the sampling result is 1, the output is 1, if the preceding positive edge is in a lock state, all sampling results at the negative edge are 0; and if a preceding negative edge of a current positive edge of the higher frequency clock is in a sampling state, the sampling result of the positive edge is valid, if the sampling result is 0, the output is 0, if the sampling result is 1, the output is 1, if the preceding negative edge is in a lock state, all sampling results of the positive edge are 0.

\* \* \* \* \*